United States Patent [19]

Suzuki et al.

[11] 4,217,535
[45] Aug. 12, 1980

[54] CONSTANT-VOLTAGE CIRCUIT WITH A DIODE AND MOS TRANSISTORS OPERATING IN THE SATURATION REGION

[75] Inventors: Yasoji Suzuki, Ayase; Takeshi Hitotsuyanagi, Kawasaki; Tetsuya Iida, Yokohama, all of Japan

[73] Assignee: Tokyo Shibaura Electric Co., Ltd., Japan

[21] Appl. No.: 864,085

[22] Filed: Dec. 23, 1977

[30] Foreign Application Priority Data

Dec. 25, 1976 [JP] Japan .................................. 51/156942
Dec. 25, 1976 [JP] Japan .................................. 51/156943

[51] Int. Cl.² .......................... H02J 7/10; H03K 3/26
[52] U.S. Cl. ...................................... 320/48; 307/304; 323/22 R; 340/636
[58] Field of Search ................... 323/16, 19, 22 R, 68, 323/69; 320/48; 340/636; 58/152 H; 307/251, 304, 310

[56] References Cited

U.S. PATENT DOCUMENTS

| | | | |
|---|---|---|---|
| 3,743,923 | 7/1973 | Steudel | 323/1 X |
| 3,832,644 | 8/1974 | Nagata et al. | 323/22 R X |
| 3,932,797 | 1/1976 | York | 320/48 |
| 4,119,904 | 10/1978 | Haglund | 340/636 X |

Primary Examiner—Robert J. Hickey
Attorney, Agent, or Firm—Finnegan, Henderson, Farabow, Garrett & Dunner

[57] ABSTRACT

A constant-voltage circuit in which a diode and an MOS transistor are connected in series between power supply terminals between which a battery power source is connected. The MOS transistor is biased to operate in the saturation region. The forward voltage drop across the diode is kept substantially constant independent of variations in battery voltage and temperature. This constant-voltage circuit may preferably be used in a battery checker circuit for detecting the end of battery life.

15 Claims, 15 Drawing Figures

TIME 4,217,535

CONSTANT-VOLTAGE CIRCUIT WITH A DIODE AND MOS TRANSISTORS OPERATING IN THE SATURATION REGION

BACKGROUND OF THE INVENTION

This invention relates to a constant-voltage circuit and more particularly, to a constant-voltage circuit suitable for a battery checking device.

In battery-powered electronic devices, such as desk-top calculators and electronic time keeping devices, it is required to incorporate a battery checking device for displaying that the battery life is coming to an end. FIG. 1 shows a prior art battery checker circuit with CMOS transistors.

With the prior art circuit, since the gm's of a p-channel transistor $T_{P1}$ having a threshold voltage $V_T$ and an n-channel transistor $T_{N1}$ with the gate supplied with a sampling pulse $\phi$ of a fixed frequency are large, the potential $V_1$ at the junction between the resistors $R_1$ and $R_2$ connected with the gate of a p-channel transistor $T_{P2}$ is approximately $(V_{DD}-V_T) \times R_2/R_1+R_2$. As the battery voltage drops, the gate-to-source voltage of the transistor $T_{P2}$ is reduced and gm of the transistor $T_{P2}$ decreases. The drop rate of the potential $V_2$ at the junction of the transistor $T_{P2}$ and a variable resistor $R_3$ connected to the input of an inverter I is greater than that of $V_1$ due to the amplifying effect of the transistor $T_{P2}$, and also is greater than the drop rate of the threshold voltage $V_{th}$ of the inverter I which is approximately half the supply voltage. The circuit is so designed that the potential $V_2$ is higher than the threshold voltage $V_{th}$ of the inverter and hence the output of the inverter I is at a low level ($V_{SS}$) when the battery voltage is at a full level with the result that an indicator L connected between the output of the inverter I and the terminal $V_{SS}$ is turned off. Since the drop rate of $V_2$ is greater than that of the threshold voltage $V_{th}$ of inverter I while the battery voltage is dropping, $V_2$ becomes lower than $V_{th}$ when the supply voltage drops below a predetermined level. Consequently, the output level of the inverter I becomes high ($V_{DD}$) and the indicator L is caused to light.

In the aforementioned circuit the threshold voltages of the inverter I and the transistor $T_{P2}$ vary depending on the manufacturing process, so that the variable resistor $R_3$ is indispensible to the adjustment of $V_2$. Further, in this circuit, both $V_1$ and $V_2$ increase with the rise in temperature, so that the indicator L does not often light even if the battery voltage drops below the predetermined level.

It is desired that the battery checker circuit be not affected by variation in the threshold voltage of the MOS transistors or by temperature change. For checking the end of battery life, it is advisable to compare a voltage varying at a fixed rate as the battery voltage drops with a reference voltage which may vary at the same rate with the battery voltage. This reference voltage is required hardly to change with temperature.

SUMMARY OF THE INVENTION

An object of this invention is to provide a constant-voltage circuit capable of keeping the forward voltage drop of a diode substantially constant independent of variations in temperature and supply voltage.

Another object of this invention is to provide a constant voltage circuit suitable for a battery checker circuit.

According to the invention, there is provided a constant-voltage circuit comprising first and second power supply terminals between which a battery power source is connected, a series circuit of a diode and a one-channel type first insulated-gate field-effect transistor with the source-drain path thereof connected in series with the diode, the series circuit being connected between the first and second power supply terminals, and a bias circuit connected between the first and second power supply terminals to allow the insulated-gate field-effect transistor to operate in the saturation region, whereby the voltage across the diode is kept substantially constant independently of variations in supply voltage and temperature.

The bias circuit includes a series circuit of a resistance impedance means and a second insulated-gate field-effect transistor having the same channel type as the first transistor and having the source-drain path connected in series with the resistance impedance means, the gate electrode of the second insulated-gate field-effect transistor being connected with the drain electrode thereof as well as with the gate electrode of the first transistor.

DETAILED DESCRIPTION OF THE PREFERRED EMBODIMENTS

Figure 1:
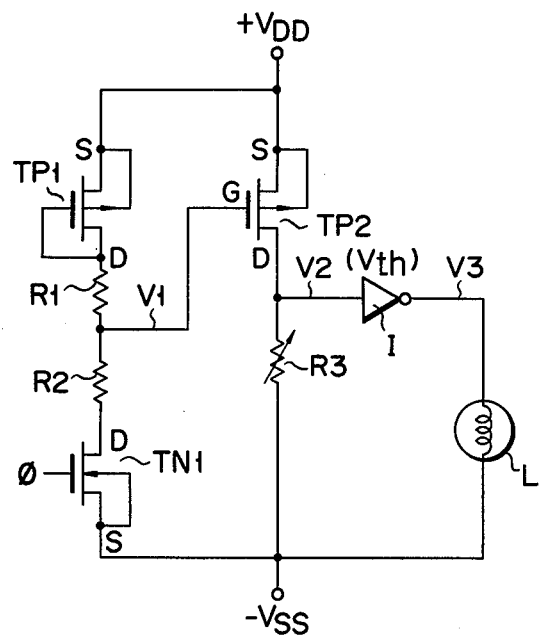
FIG. 1 shows a prior art battery checker circuit.
Figure 2:
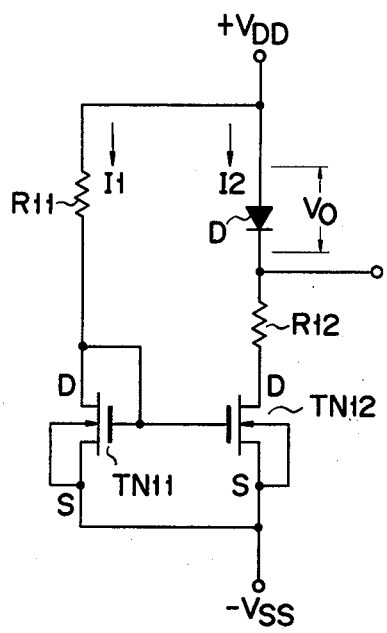
FIG. 2 shows the constant-voltage circuit of this invention suitable for use in a battery checker.

As shown in FIG. 2, the constant-voltage circuit of the invention includes a first series circuit of a resistor $R_{11}$ and an n-channel MOS transistor $T_{N11}$ and a second series circuit of a diode D, a resistor $R_{12}$, and an n-channel MOS transistor $T_{N12}$, each connected between power supply terminals $V_{DD}$ and $V_{SS}$ between which a battery is connected. The gate electrodes of the transistors $T_{N11}$ and $T_{N12}$ are connected with each other, and further connected with the drain electrode of the transistor $T_{N11}$. The transistor $T_{N11}$ operates in the saturation region, so that the first series circuit operates as a constant-current source. If the transistors $T_{N11}$ and $T_{N12}$, in an integrated circuit, are formed with the same dimensions, the transistor $T_{N12}$ will be so biased as to operate in the saturation region by means of the first series circuit or bias circuit composed of the transistor $T_{N11}$ and the resistor $R_{11}$. Therefore, current $I_1$ flowing through the first series circuit, which is determined by the value of the resistor $R_{11}$, is equal to current $I_2$ flowing through the second series circuit.

Since the diode D is forward-biased, its voltage drop $V_0$ is substantially constant. The forward characteristic of the diode is given as follows:

$$V_0 = \frac{kT}{q} \ln \frac{I_2}{I_s} \qquad (1)$$

where
k: Boltzmann's constant
T: absolute temperature
q: electronic charge
$I_s$: reverse saturation current.

As seen from equation (1), the level of voltage drop of the diode D hardly changes for the varying value of the currents $I_1$ and $I_2$ resulting from the variation in the threshold voltages of the transistors $T_{N11}$ and $T_{N12}$ in the circuit of FIG. 2.

The change in the voltage drop of the diode with temperature is given by $$\frac{dV_0}{dT} = -\frac{k}{T} \{\ln \frac{I_2}{I_s} + T(\frac{1}{I_2} \cdot \frac{dI_2}{dT} - \frac{1}{I_s} \cdot \frac{dI_s}{dT})\} \qquad (2)$$

As is clear from equation (2), $dV_0/dT$ may be minimized by reducing the term $$T(\frac{1}{I_2} \cdot \frac{dI_2}{dT} - \frac{1}{I_s} \cdot \frac{dI_s}{dT})$$

substantially to zero. If $$T = 300° K., \frac{kT}{q} \cdot \frac{1}{I_s} \cdot \frac{dI_s}{dT} \simeq 4mV/deg.$$

Figure 3:
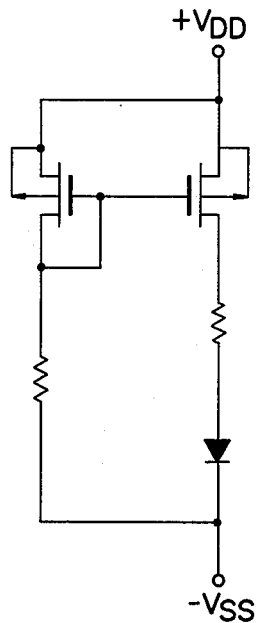
FIG. 3 shows a modification of the constant-voltage circuit of FIG. 2.

The sign of the temperature coefficient of current of the MOS transistor depends on its operating region. That is, the temperature coefficient of current is negative in the unsaturation region, while it is positive in the saturation region, especially where the gate voltage is a little higher than the threshold voltage. The temperature coefficient of diode current is positive. Since the transistor $T_{N12}$ in the circuit of FIG. 2 operates in the saturation region, the temperature coefficient of the current $I_2$ flowing through the diode D and transistor $T_{N12}$ is positive. Accordingly, the term $$\frac{1}{I_2} \cdot \frac{dI_2}{dT} - \frac{1}{I_s} \cdot \frac{dI_s}{dT}$$

of equation (2) may be reduced substantially to zero by causing the transistor $T_{N12}$ connected in series with the diode D to operate in the saturation region. Accordingly, the circuit of FIG. 2 may keep the voltage drop across the diode D constant and independent of the variations in the supply voltage and temperature. In the circuit of FIG. 2 the resistor $R_{12}$ is not always needed. FIG. 3 shows a modification of the constant-voltage circuit of FIG. 2 in which p-channel transistors are used in lieu of n-channel transistors.

Figure 4:
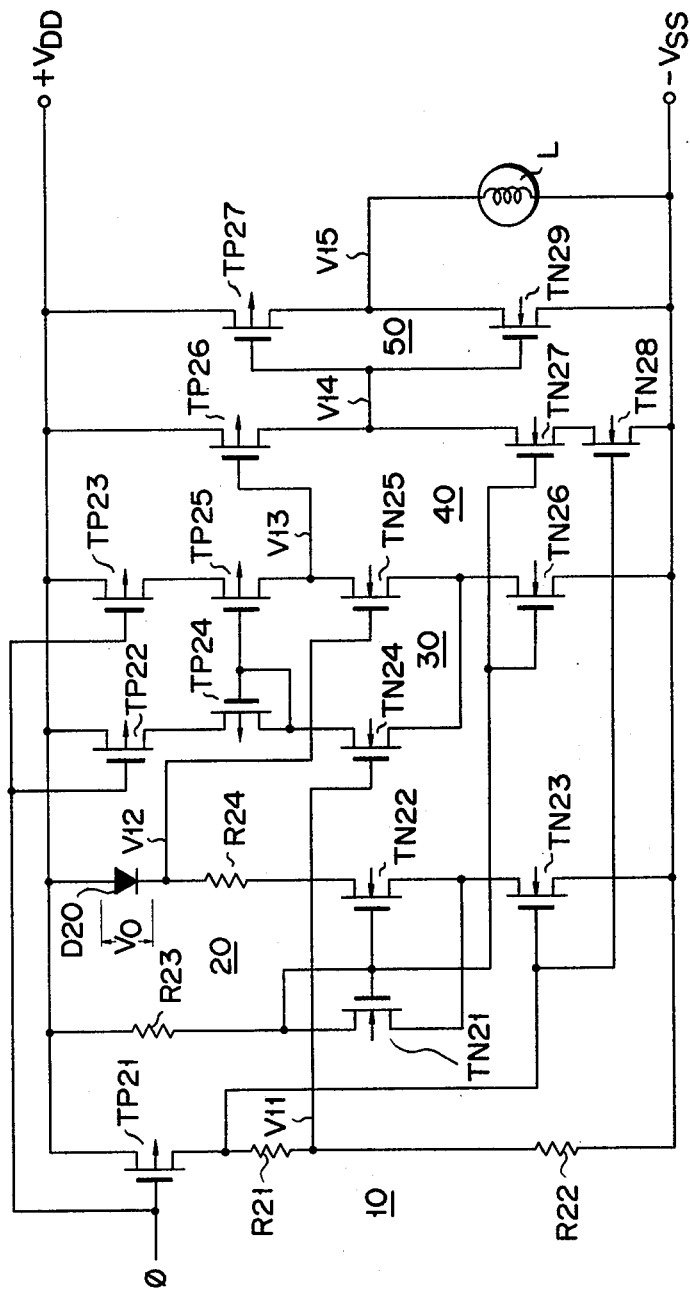
FIG. 4 shows an embodiment of the battery checker according to the invention employing the constant-voltage circuit of FIG. 2.

FIG. 4 shows a battery checker circuit with the constant-voltage circuit as shown in FIG. 2. This battery checker circuit is composed of a resistance divider circuit section 10, a constant-voltage circuit section 20, a voltage comparator circuit section or differential amplifier section 30, an output circuit section 40, and an inverter 50 each connected between power supply terminals $V_{DD}$ and $V_{SS}$ between which a battery is connected. A visual indicator L such as a lamp is connected between the output of the inverter 50 and the power supply terminal $V_{SS}$ (circuit ground). Each circuit section may preferably be integrated with other circuits of an electronic device on the same semiconductor substrate.

The resistance divider circuit section 10 is composed of a series connection of a p-channel switching MOS transistor $T_{P21}$ with the gate electrode supplied with a clock pulse $\phi$ and resistance elements $R_{21}$ and $R_{22}$. The transistor $T_{P21}$ is formed with a gm large enough to render the source-to-drain voltage thereof negligible as compared with the voltage drop across the resistors $R_{21}$ and $R_{22}$. Therefore, the potential $V_{11}$ at the junction of the resistors $R_{21}$ and $R_{22}$ is determined by the ratio of resistance division, and thus substantially equals $V_{DD} \times R_{22}/R_{21} + R_{22}$.

The constant-voltage circuit section 20 includes a constant-voltage circuit like the one as shown in FIG. 2 composed of n-channel MOS transistors $T_{N21}$ and $T_{N22}$, resistors $R_{23}$ and $R_{24}$, and a diode $D_{20}$, and an n-channel switching transistor $T_{N23}$ connected in series with the constant-voltage circuit. The gate of the transistor $T_{N23}$ is connected with the junction of the transistor $T_{P21}$ and resistor $R_{21}$.

The voltage comparator circuit 30 is composed of p-channel switching transistors $T_{P22}$ and $T_{P23}$, p-channel load transistors $T_{P24}$ and $T_{P25}$, n-channel input transistors $T_{N24}$ and $T_{N25}$, and an n-channel constant-current source transistor $T_{N26}$. The switching transistors $T_{P22}$ and $T_{P23}$ are connected to receive the clock pulse $\phi$ at their gate electrodes. The gate of the input transistor $T_{N24}$ is connected with the division point of the resistance divider circuit section 10, while the gate of the input transistor $T_{N25}$ is connected with the junction of the diode $D_{20}$ and the resistor $R_{24}$ in the constant-voltage circuit. The gate of the transistor $T_{N26}$ is connected with the gate of the transistor $T_{N21}$ of the constant-voltage circuit. The gate electrodes of the transistors $T_{P24}$ and $T_{P25}$ are connected with each other as well as with the drain electrode of the transistor $T_{P24}$, thereby improving the common-mode rejection ratio.

The output circuit 40 is composed of a series connection of a p-channel amplifying transistor $T_{P26}$, an n-channel load transistor $T_{N27}$, and an n-channel switching transistor $T_{N28}$. The gate of the transistor $T_{P26}$ is connected with the junction of the transistors $T_{P25}$ and $T_{N25}$, while the gate of the transistor $T_{N27}$ is connected with the drain of the transistor $T_{N21}$ and the gate of the transistor $T_{N28}$ is connected with the gate of the transistor $T_{N23}$.

The inverter 50 is composed of complementary transistors $T_{P27}$ and $T_{N29}$, whose gate electrodes are connected together to the junction of the transistors $T_{P26}$ and $T_{N27}$. All the MOS transistors of this embodiment are of enhancement type.

The switching transistors $T_{N23}$, $T_{P22}$, $T_{P23}$ and $T_{N28}$, like the switching transistor $T_{P21}$, are so formed as to have a large gm. All the switching transistors are caused to conduct when the clock pulse $\phi$ is at a low level ($V_{SS}$ level), while they are rendered nonconducting when the clock pulse $\phi$ is at a high level ($V_{DD}$ level). The function of the switching transistors is to minimize the power dissipation in the battery checker circuit.

Referring now to the waveforms of FIGS. 5A to 5G which are depicted in exaggerated form, there will be described the operation of the battery checker of FIG. 4.

While the battery has a voltage level enough to operate the electronic device, the output voltage $V_{12}$ of the constant-voltage circuit 20 is higher than the output voltage $V_{11}$ of the resistance divider circuit 10. Therefore, the output voltage of the difference amplifier circuit 30 with a large gain is at the $V_{SS}$ level, while the output voltages $V_{14}$ and $V_{15}$ of the output circuit 40 and the inverter 50 are at the $V_{DD}$ and $V_{SS}$ levels respectively. Consequently, the lamp L will not light.

Figure 5A:
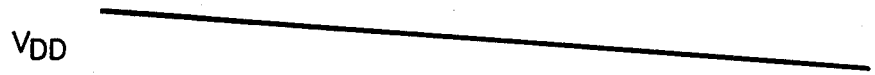
FIGS. 5A to 5G are diagrams for explaining the operation of the battery checker of FIG. 4.
Figure 5B:
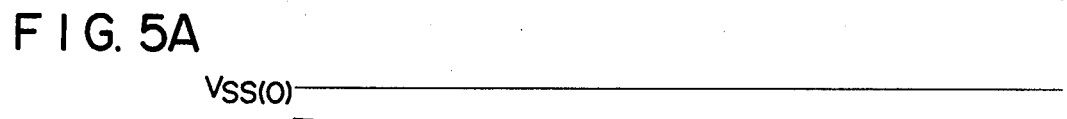
Figure 5C:
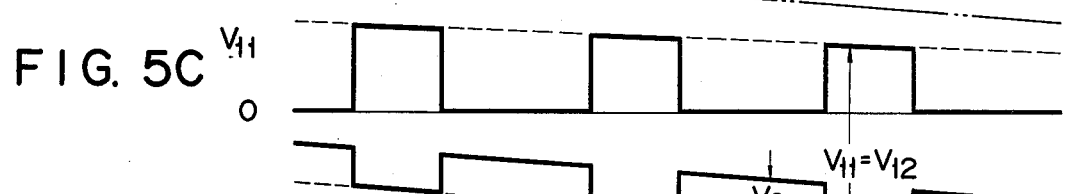
Figure 5D:
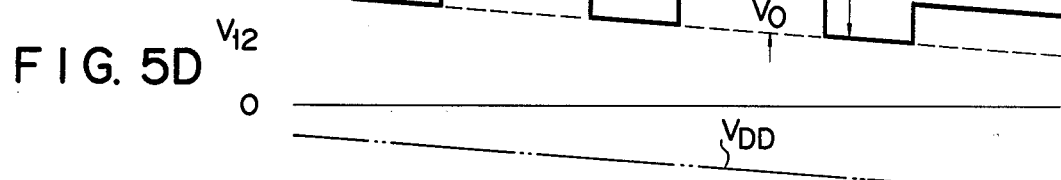
Figure 5E:
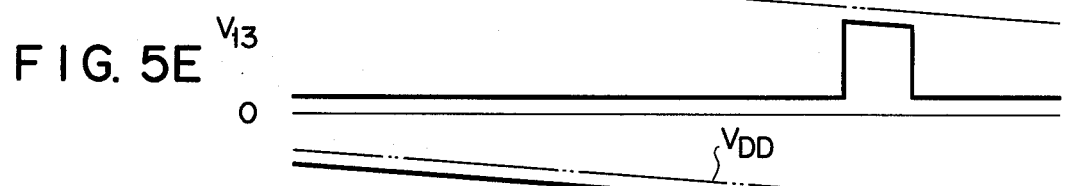
Figure 5F:
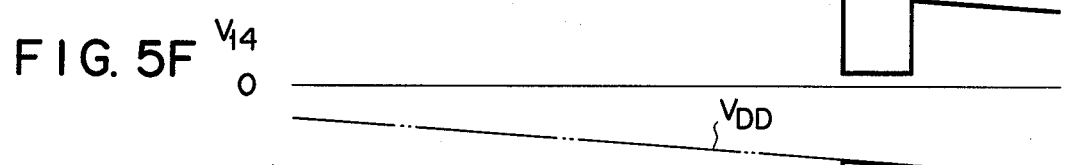
Figure 5G:
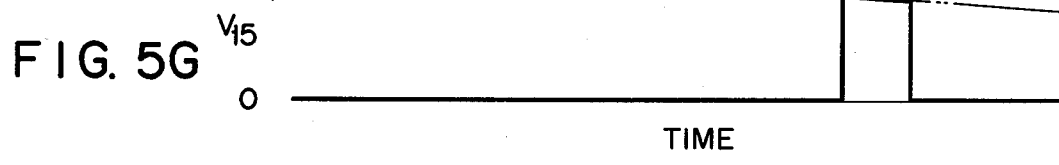

As shown in FIG. 5A, the battery voltage $V_{DD}$ drops with time through the use of the electronic device. As the voltage $V_{DD}$ drops, the amplitude of the clock pulse $\phi$ also is reduced as shown in FIG. 5B. While the output voltage $V_{11}$ of the resistance divider circuit 10 is changed in a pulse-like form as shown in FIG. 5C by conduction and nonconduction of the switching transistor $T_{P21}$, the dropping rate of voltage $V_{11}$ at the sampling time the transistor $T_{P21}$ is conducting, is lower than that of $V_{DD}$. The output voltage $V_{12}$ of the constant-voltage circuit 20 is changed as shown in FIG. 5D by conduction and nonconduction of the switching transistor $T_{N23}$. Since the voltage drop across the diode $D_{20}$ is constant, the drop rate of $V_{12}$ at sampling times is equal to that of $V_{DD}$. The drop rate of the output voltage $V_{12}$ of the circuit 20 is greater than the drop rate of the output voltage $V_{11}$ of the resistance divider circuit 10, so that $V_{12}$ becomes lower than $V_{11}$ as the battery voltage drops below a predetermined level, though $V_{12} > V_{11}$ while the battery voltage is fully high. The output voltage $V_{13}$ of the difference amplifier circuit 30 is approximately $\frac{1}{2}V_{DD}$ where $V_{12} = V_{11}$, while it is raised substantially to the $V_{DD}$ level where $V_{11} > V_{12}$, as shown in FIG. 5E. Thus, the source-to-gate voltage of the transistor $T_{P26}$ is lowered below the threshold voltage thereof so that the transistor $T_{P26}$ is rendered nonconducting. Consequently, the voltage $V_{14}$ is reduced substantially to the $V_{SS}$ level, as shown in FIG. 5F, the render the transistor $T_{P27}$ of the inverter 50 conducting. As a result, the output voltage $V_{15}$ of the inverter 50 attains the $V_{DD}$ level as shown in FIG. 5G, and the indicator L lights. Thereafter, the indicator lights at every sampling time.

Figure 6:
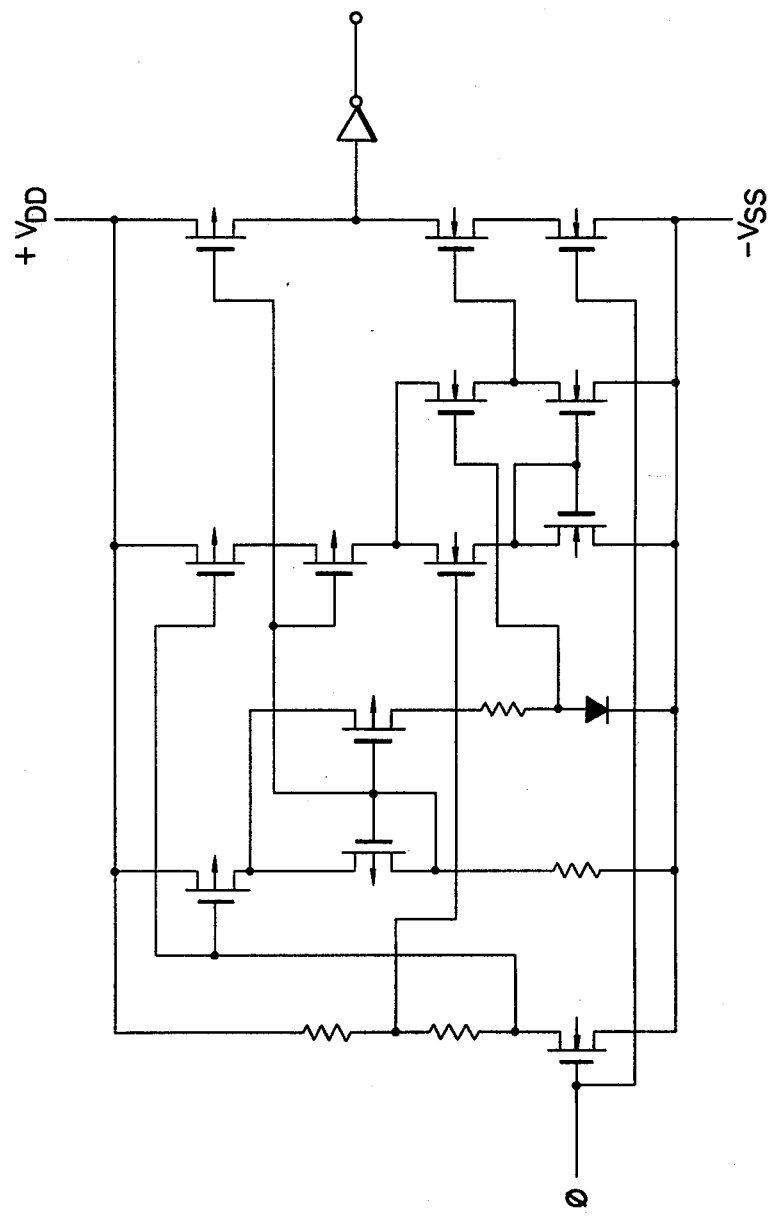
FIG. 6 shows a modification of the battery checker of FIG. 4.

FIG. 6 shows an alternative embodiment of the invention in which there are used MOS transistors opposite in channel type to the corresponding MOS transistors used with the embodiment of FIG. 4. In the embodiment of FIG. 6 the output voltage of the constant-voltage circuit is always constant relative to the reference potential ($V_{SS}$), and one switching transistor is employed in the voltage comparator circuit.

Figure 7:
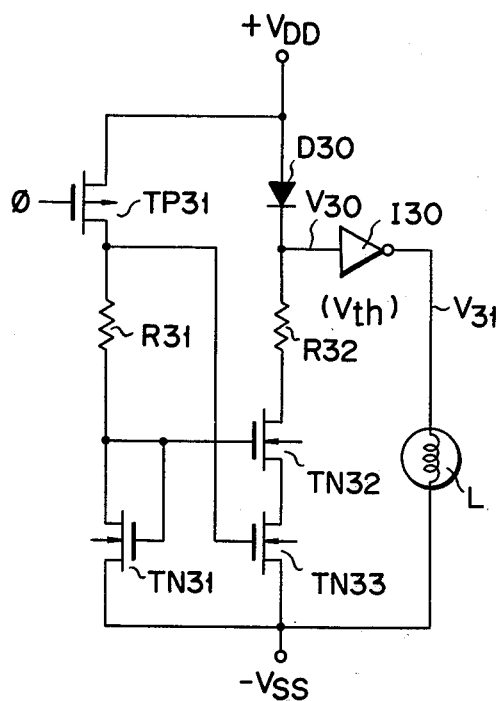
FIG. 7 shows another embodiment of the battery checker employing the constant-voltage circuit of FIG. 2.
Figure 8:
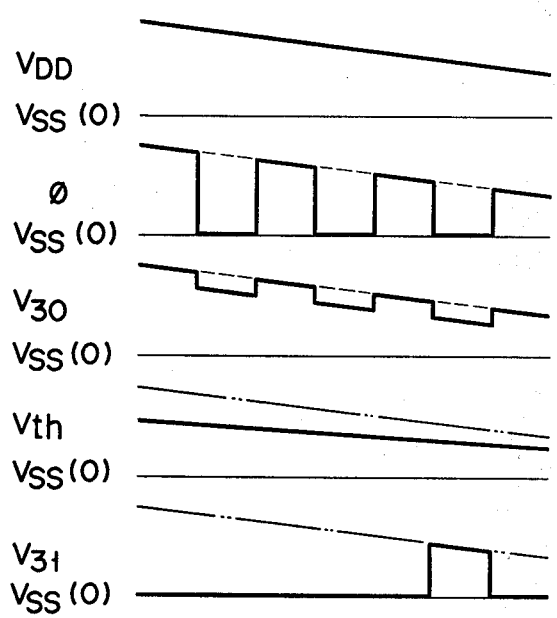
FIG. 8 is a diagram for explaining the operation of the battery checker of FIG. 7.

FIG. 7 shows another embodiment of the battery checker. In this embodiment there is used a constant-voltage circuit similar to the constant-voltage circuit FIG. 2, composed of n-channel transistors $T_{N31}$ and $T_{N32}$, resistors $R_{31}$ and $R_{32}$, and a diode $D_{30}$. Further, between the resistor $R_{31}$ and the $V_{DD}$ terminal is connected a p-channel switching transistor $T_{P31}$ with the gate supplied with a sampling pulse $\phi$, while between the transistor $T_{N32}$ and the $V_{SS}$ terminal is connected an n-channel switching transistor $T_{N33}$ with the gate connected with the drain of the transistor $T_{P31}$. The junction of the diode $D_{30}$ and resistor 32 is connected to the input of an inverter $I_{30}$, and an indicator L is connected between the output of the inverter $I_{30}$ and the $V_{SS}$ terminal. In this embodiment the output $V_{30}$ of the constant-voltage circuit is set higher than the threshold voltage $V_{th}$ of the inverter $I_{30}$ while the battery voltage is fully high. Therefore, the output voltage of the inverter $I_{30}$ is at the $V_{SS}$ level, and the indicator L does not light. The threshold voltage $V_{th}$ of the inverter $I_{30}$ drops as the supply voltage drops, as shown in FIG. 8, though the drop rate of the former is lower than that of the latter. Since the drop rate of the output voltage of the constant-voltage circuit is equal to that of the supply voltage, $V_{30}$ becomes lower than $V_{th}$ when the supply voltage drops below a predetermined level. Accordingly, the output voltage $V_{31}$ of the inverter $I_{30}$ is raised to the high level to light the indicator L. Thereafter, the indicator lights at every sampling time.

Figure 9:
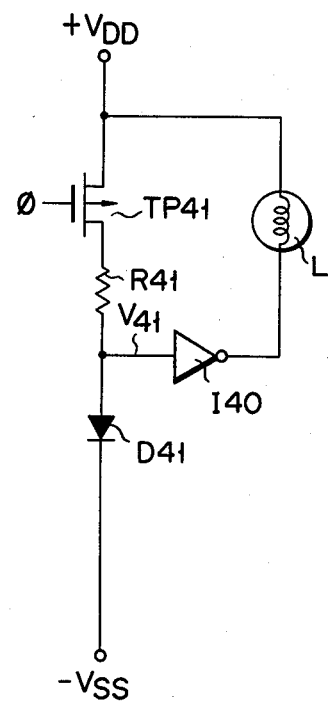
FIG. 9 shows still another embodiment of the battery checker.

FIG. 9 shows still another embodiment of the battery checker. In this embodiment a p-channel switching transistor $T_{P41}$, a resistor $R_{41}$, and a diode $D_{41}$ are connected in series between $V_{DD}$ and $V_{SS}$ terminals. The junction of the resistor $R_{41}$ and diode $D_{41}$ is connected to the input of an inverter $I_{40}$. An indicator L is connected between the output of the inverter $I_{40}$ and the $V_{DD}$ terminal. In this embodiment the input voltage $V_{41}$ of the inverter $I_{40}$ at sampling time is constant and independent of the variations in the supply voltage, because of the constant-voltage characteristic of the diode $D_{40}$. The threshold voltage $V_{th}$ of the inverter $I_{40}$ varies with the supply voltage. While the supply voltage is fully high, $V_{41} < V_{th}$, so that the output voltage of the inverter $I_{40}$ is at the $V_{DD}$ level, the indicator L is not lighted. When the supply voltage drops, the input voltage $V_{41}$ becomes higher than $V_{th}$. Thereupon, the output voltage of the inverter $I_{40}$ attains the $V_{SS}$ level to light the indicator L. Thereafter, the indicator L lights at every sampling time.

What we claim is:

1. A constant-voltage circuit comprising:
   first and second power supply terminals between which a battery power source is connected;
   a series circuit of a diode and a one-channel type first insulated-gate field-effect transistor with the source-drain path thereof connected in series with said diode between said first and second power supply terminals, said diode of said series circuit being connected in the forward direction with respect to the polarity of a voltage applied between said first and second power supply terminals; and
   a bias circuit connected between said first and second power supply terminals and to said first transistor to allow said first transistor to operate in the saturation region, whereby the voltage across said diode is kept substantially constant independently of the variations in supply voltage and temperature.

2. A constant-voltage circuit according to claim 1, wherein said bias circuit includes a series circuit of a resistive impedance means and a second insulated-gate field-effect transistor having the same channel type as said first transistor and having the source-drain path connected in series with said resistive impedance means, the gate electrode of said second insulated-gate field-effect transistor being connected with the drain electrode thereof as well as with the gate electrode of said first transistor.

3. A constant-voltage circuit comprising:
   first and second power supply terminals between which a battery power source is connected;
   a first series circuit connected between said first and second power supply terminals and including a diode and a one-channel type first insulated-gate field-effect transistor with the source-drain path thereof connected in series with said diode which diode is connected in the forward direction with respect to the polarity of a voltage applied between said first and second power supply terminals; and a second series circuit connected between said first and second power supply terminals and including a resistive impedance means and a second insulated-gate field-effect transistor having the same channel type as said first transistor and having the source-drain path connected in series with said resistive impedance means, the gate electrode of said second insulated-gate field-effect transistor being connected with the drain electrode thereof as well as with the gate electrode of said first transistor to allow said first transistor to operate in the saturation region, whereby the voltage across said diode is kept substantially constant independently of variations in supply voltage and temperature.

4. A battery checker circuit comprising:

first and second power supply terminals between which a battery power source is connected;

a first circuit connected between said first and second power supply terminals and providing a first output voltage proportional to the voltage of said battery power source;

a second circuit connected between said first and second power supply terminals, including a series circuit of a diode and a one-channel type first insulated-gate field-effect transistor with the source-drain path thereof connected in a series with said diode and with said diode connected in the forward direction with respect to the polarity of a voltage applied between said first and second power supply terminals; and a bias circuit connected to said first transistor to allow said transistor to operate in the saturation region, and providing a second output voltage from the junction of said diode and transistor;

a voltage comparator circuit connected between said first and second power supply terminals for comparing said first and second output voltages of said first and second circuits, and providing at the output thereof a high- or low-level output voltage when said first and second output voltages are not equal;

an inverter circuit powered from said battery power source to provide at the output thereof a high- or low-level output voltage in response to an output voltage of said voltage comparator circuit; and indicator means responsive to an output voltage of said inverter circuit to indicate that the voltage of said battery power source has dropped below a predetermined level.

5. A battery checker circuit according to claim 4, wherein said first circuit is a voltage dividing resistance circuit.

6. A battery checker circuit according to claim 4, wherein said bias circuit includes a series circuit of a resistive impedance means and a second insulated-gate field-effect transistor having the same channel type as said first transistor and having the source-drain path connected in series with said resistive impedance means, the gate electrode of said second insulated-gate field-effect transistor being connected with the drain electrode thereof as well as with the gate electrode of said first transistor.

7. A battery checker circuit according to claim 4, wherein said first and second circuits and said voltage comparator circuit are each provided with a switching insulated-gate field-effect transistor connected in series therewith and with means for periodically connecting each of said first and second circuits and said voltage comparator to said first and second power supply terminals to switch said first and second circuits and said voltage comparator circuit on and off at a predetermined frequency.

8. A battery checker circuit according to claim 4, wherein said inverter circuit is a CMOS inverter.

9. A battery checker circuit comprising:

first and second power supply terminals between which a battery power source is connected;

a series circuit of a diode and a one-channel type first insulated-gate field-effect transistor with the source-drain path thereof connected in series with said diode between said first and second power supply terminals, said diode being connected in the forward direction with respect to the polarity of a voltage applied between said first and second power supply terminals;

a bias circuit connected between said first and second power supply terminals and to said first transistor to allow said first transistor to operate in the saturation region;

an inverter circuit with the input thereof connected to the junction of said diode and said first transistor; and indicator means connected to the output of said inverter circuit to indicate that the voltage of said battery power source has dropped below a predetermined level.

10. A battery checker circuit according to claim 9, wherein said bias circuit includes a series circuit of a resistive impedance means and a second insulated-gate field-effect transistor having the same channel type as said first transistor and having the source-drain path connected in series with said resistive impedance means, the gate electrode of said second insulated-gate field-effect transistor being connected with the drain electrode thereof as well as with the gate electrode of said first transistor.

11. A battery checker circuit according to claim 9, wherein said series circuit and said bias circuit are each provided with a switching insulated-gate field-effect transistor connected in series therewith and with means for periodically connecting each of said first and second circuits and said voltage comparator to said first and second power supply terminals to switch said first and second circuits and said voltage comparator circuit on and off at a predetermined frequency.

12. A battery checker circuit according to claim 9, wherein said inverter circuit is a CMOS inverter.

13. A battery checker circuit comprising:

first and second power supply terminals between which a battery power source is connected;

a series circuit of a resistive impedance means and a forward biased diode connected between said first and second power supply terminals;

an inverter circuit with the input thereof directly connected to the junction of said resistive impedance means and said diode; and indicator means connected to the output of said inverter circuit to indicate that the voltage of said battery power source has dropped below a predetermined level.

14. A battery checker circuit according to claim 13, wherein said series circuit is provided with a switching insulated-gate field-effect transistor connected in series therewith and with means for periodically connecting said series circuit to said first and second power supply terminals to switch said series circuit on and off at predetermined frequency.

15. A battery checker circuit accordint to claim 13, wherein said inverter circuit is a CMOS inverter.

* * * * *